United States Patent
Hsu et al.

(10) Patent No.: US 7,148,533 B2
(45) Date of Patent: Dec. 12, 2006

(54) MEMORY RESISTANCE FILM WITH CONTROLLED OXYGEN CONTENT

(75) Inventors: Sheng Teng Hsu, Camas, WA (US); Fengyan Zhang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/226,998

(22) Filed: Sep. 14, 2005

(65) Prior Publication Data

US 2006/0011897 A1    Jan. 19, 2006

Related U.S. Application Data

(62) Division of application No. 10/442,628, filed on May 21, 2003, now Pat. No. 6,972,238.

(51) Int. Cl.
    *H01L 27/96*    (2006.01)
(52) U.S. Cl. .................. 257/295; 257/E27.006
(58) Field of Classification Search .......... 257/295, 257/310, 314; 255/27.006
    See application file for complete search history.

(56) References Cited

U.S. PATENT DOCUMENTS

| 6,870,755 | B1* | 3/2005 | Rinerson et al. ............ 365/148 |
| 2004/0160817 | A1* | 8/2004 | Rinerson et al. ............ 365/171 |

* cited by examiner

*Primary Examiner*—Bradley K. Smith
(74) *Attorney, Agent, or Firm*—Law Office of Gerald Maliszewski; Gerald Maliszewski

(57) ABSTRACT

A memory cell and method for controlling the resistance properties in a memory material are provided. The method comprises: forming manganite; annealing the manganite in an oxygen atmosphere; controlling the oxygen content in the manganite in response to the annealing; and, controlling resistance through the manganite in response to the oxygen content. The manganite is perovskite-type manganese oxides with the general formula $RE_{1-x}AE_xMnO_y$, where RE is a rare earth ion and AE is an alkaline-earth ion, with x in the range between 0.1 and 0.5. Controlling the oxygen content in the manganite includes forming an oxygen-rich $RE_{1-x}AE_xMnO_y$ region where y is greater than 3. A low resistance results in the oxygen-rich manganite region. When y is less than 3, a high resistance is formed. More specifically, the process forms a low resistance oxygen-rich manganite region adjacent an oxygen-deficient high resistance manganite region.

21 Claims, 6 Drawing Sheets

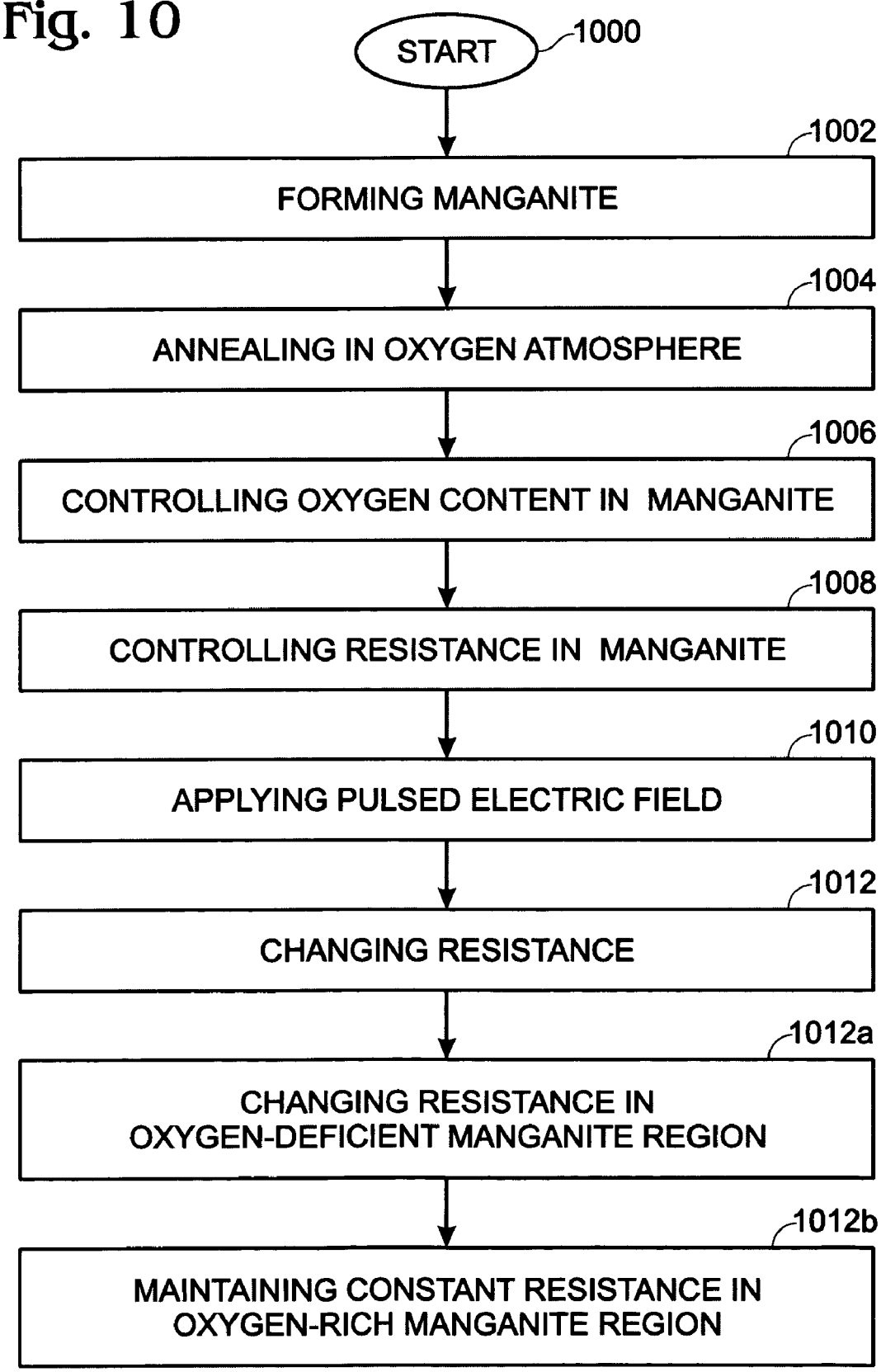

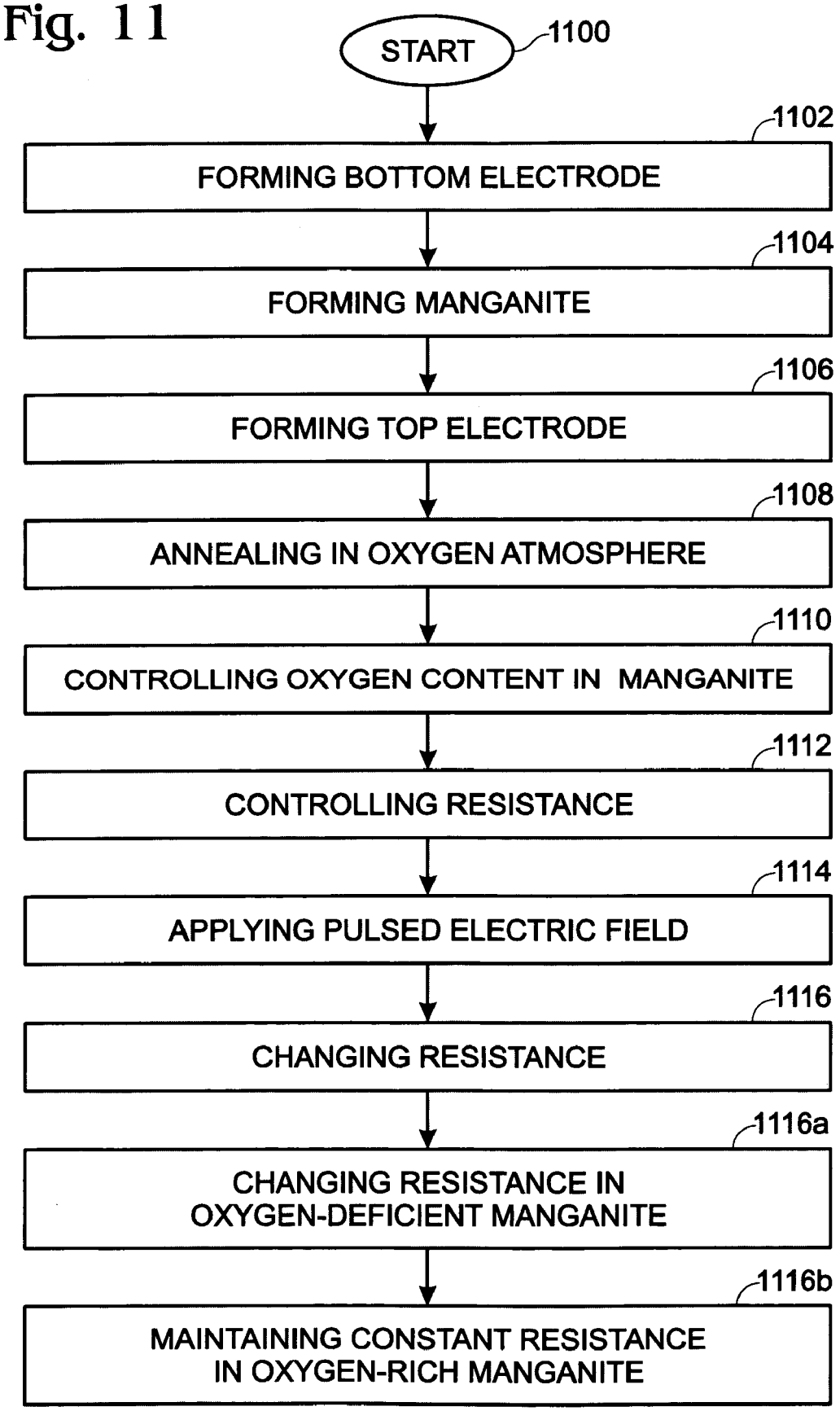

MEMORY RESISTANCE FILM WITH CONTROLLED OXYGEN CONTENT

RELATED APPLICATIONS

This application is a Divisional Application of a patent application entitled, OXYGEN CONTENT SYSTEM AND METHOD FOR CONTROLLING MEMORY RESISTANCE PROPERTIES, invented by Hsu et al., Ser. No. 10/442,628, filed May 21, 2003 now U.S. Pat. No. 6,972, 238.

BACKGROUND OF THE INVENTION

1. Field of the Invention

This invention generally relates to integrated circuit (IC) memory resistor cell arrays and, more particularly, to an oxygen content system for controlling memory resistance properties in a memory resistor cell and a method for fabricating the same.

2. Description of the Related Art

Conventionally, memory cells using a memory resistor material, such as colossal magnetoresistance (CMR) materials, are fabricated with large unpatterned conductive bottom electrodes, unpatterned CMR material, and relatively small top electrodes. These devices work in limited applications, but they are not suitable for dense memory array applications because of relatively large size of the cells.

The CMR material can be said to have a non-volatile nature, as the resistance of the CMR material remains constant under most circumstances. However, when a high electric field induces current flow through the CMR material, a change in the CMR resistance can result. During a programming process, the resistivity of the memory resistor at the high field region near the electrode changes first. Experimental data shows that the resistivity of the material at the cathode, referred as terminal A, is increased while that at the anode, referred as terminal B, is decreased. During the erase process the pulse polarity is reversed. That is, the designation of cathode and anode are reversed. Then, the resistivity of the material near terminal A is decreased, and the resistivity near terminal B is increased.

As the demand increases for cell memory, there is increased motivation to reduce the size of cells in the array. However, smaller feature sizes make the device more susceptible to process tolerance errors. Due to process tolerances, extremely small geometrically asymmetrical devices are difficult to reliably fabricate. However, an analysis (provided below) shows that fabricated memory cells that are sufficiently symmetrical, will not work properly. Even if these symmetrical devices can be programmed, the net resistance change from high resistance-state to low resistance-state may be relatively low.

It would be advantageous to build memory cells with enough asymmetry to guarantee significant resistance state changes despite process tolerancing.

SUMMARY OF THE INVENTION

The present invention describes a thin film resistance memory device suitable for non-volatile memory array and analog resistance applications. The present invention memory cell can be reliably programmed, even if fabricated as a resistive non-volatile ultra small size memory cell, because of its asymmetrical characteristics.

Accordingly, a method is provided for controlling the resistance properties in a memory material. The method comprises: forming manganite; annealing the manganite in an oxygen atmosphere; controlling the oxygen content in the manganite in response to the annealing; and, controlling resistance through the manganite in response to the oxygen content. The manganite is a material selected from the group including perovskite-type manganese oxides with the general formula $RE_{1-x}AE_xMnO_y$, where RE is a rare earth ion and AE is an alkaline-earth ion, with x in the range between 0.1 and 0.5.

In some aspects of the method, controlling the oxygen content in the manganite includes forming an oxygen-rich $RE_{1-x}AE_xMnO_y$ region where y is greater than 3. A low resistance results in the oxygen-rich manganite region. In other aspects, controlling the oxygen content in the manganite includes forming an oxygen-deficient $RE_{1-x}AE_xMnO_y$ region where y is less than 3. A high resistance is formed in the oxygen-deficient manganite region. More specifically, the process forms a first, low resistance in the oxygen-rich manganite region and a second resistance in the oxygen-deficient manganite region, higher than the first resistance. For example, the oxygen-rich manganite region may overlie the oxygen-deficient manganite region.

In some aspects the method further comprises: applying a pulsed electric field to the manganite; and, changing the overall resistance through the manganite in response to the pulsed electric field. More specifically, changing the overall resistance through the manganite in response to the pulsed electric field includes: changing the resistance in the oxygen-deficient manganite region; and, maintaining a constant resistance in the oxygen-rich manganite region.

Additional details of the above-described method and an oxygen content-controlled memory resistor device are provided below.

BRIEF DESCRIPTION OF THE DRAWINGS

FIG. 10 is a flowchart illustrating the present invention method for controlling the resistance properties in a memory material.

FIG. 11 is a flowchart illustrating the present invention method for controlling the resistance properties in a memory resistor or memory cell.

DETAILED DESCRIPTION OF THE PREFERRED EMBODIMENTS

Figure 1A:
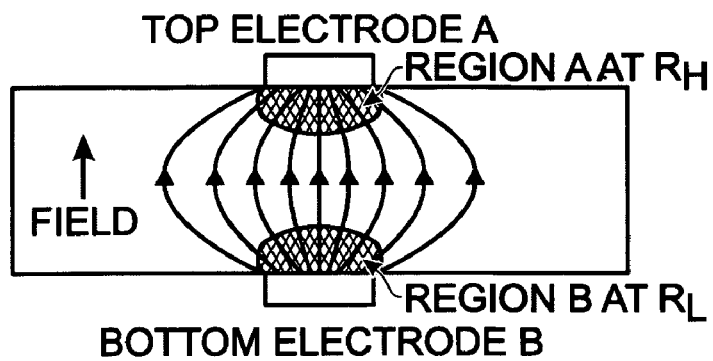
FIGS. 1A and 1B are partial cross-sectional views of a memory cell during programming (FIG. 1A) and erasing (FIG. 1B) operations.
Figure 1B:
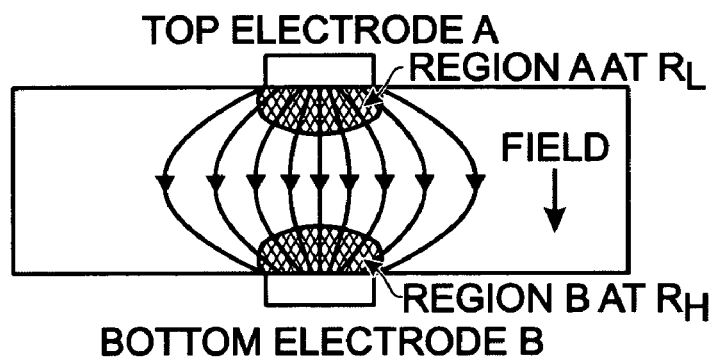

FIGS. 1A and 1B are partial cross-sectional views of a memory cell during programming (FIG. 1A) and erasing (FIG. 1B) operations. The top and bottom electrodes are identical and the memory resistance material is uniform throughout. If the geometric structure of the device could be made perfectly symmetrical, the net resistance would remains constant, in a high-resistance state, when either a negative field (FIG. 1A) or a positive field (FIG. 1B) is applied. In such circumstances, programming is not possible. Therefore, a perfectly symmetrical device structure, such as one in FIGS. 1A and 1B, is not practical.

More specifically, the geometrically symmetrical memory cell has a high current density near the electrodes (regions A and B), and a low current density in the center portion of the device, in the presence of an electric field. As a result, the resistivity of the CMR material near the top and bottom electrodes is changed. For example, the memory cell can be programmed to be in the high-resistance state if the resistivity of the memory resistor material near the top electrode is increased, and the resistivity of memory resistor material near the bottom electrode is decreased. When the polarity of the electric pulse applied to top electrode is reversed (becomes a positive pulse, FIG. 1B), the material near the top electrode (Region A) becomes low resistance (RL), while the material near the bottom electrode (Region B) becomes high resistance (RH). However, the overall resistance of the memory resistance remains the same, still in the high-resistance state. Therefore, it is not possible to program the memory resistor to the low-resistance state.

Since region A and region B are very close to the top and bottom electrode, respectively, and their thicknesses may be as thin as a 10 nanometers (nm), the above-described effect may be mistakenly classified as an interface effect. However, memory is not an interface property change, but is a bulk resistivity change.

Figure 2A:
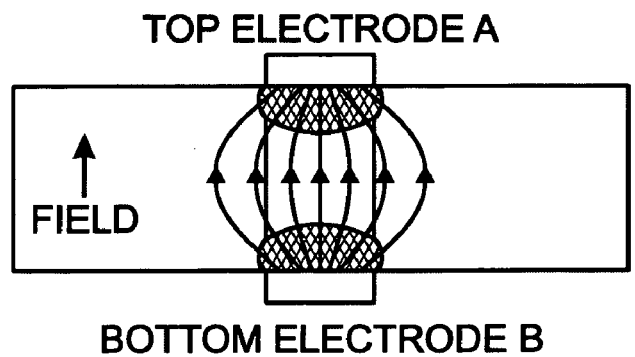
FIGS. 2A and 2B are partial cross-sectional views of a memory cell, where the memory resistor has a cylindrical shape and is embedded in oxide or any suitable insulator.
Figure 2B:
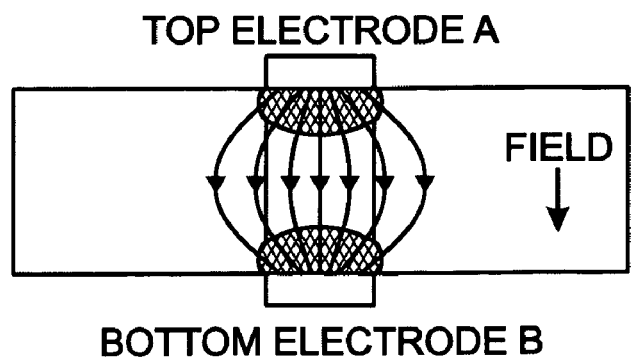

FIGS. 2A and 2B are partial cross-sectional views of a memory cell, where the memory resistor has a cylindrical shape and is embedded in oxide or any suitable insulator. The field intensity is high near both top and bottom electrodes. Since the field direction near the top electrode is opposite that near the bottom electrode, the resistivity of the memory resistor material near the top electrode is increased while the resistivity of the memory resistor material near the bottom electrode is reduced. As a result, the memory resistance is programmed to the high-resistance state regardless of whether a positive or negative pulse is applied to the top electrode. Again, a geometrically symmetrical structure is not suitable for resistor memory cell.

Figure 3:
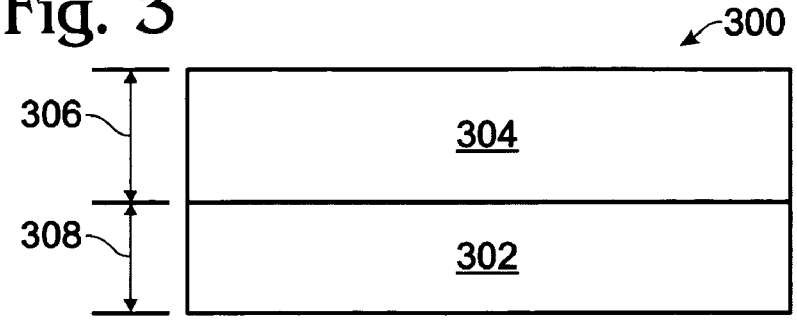
FIG. 3 is partial cross-sectional view of the present invention memory resistance film with controlled oxygen content.

FIG. 3 is partial cross-sectional view of the present invention memory resistance film with controlled oxygen content. The film 300 comprises an oxygen-deficient manganite region 302 and an oxygen-rich manganite region 304, adjacent the oxygen-deficient manganite region 302. As shown, the oxygen-rich manganite region 304 overlies the oxygen-deficient region 302. However, in other aspects (not shown), the oxygen-deficient manganite region 302 may overlie the oxygen-rich manganite region 304. The oxygen-rich manganite region 304 is selected from the group including perovskite-type manganese oxides with the general formula $RE_{1-x}AE_xMnO_y$, where RE is a rare earth ion and AE is an alkaline-earth ion, with x in the range between 0.1 and 0.5, and y being greater than 3. The oxygen-deficient manganite region 302 is selected from the group including perovskite-type manganese oxides with the general formula $RE_{1-x}AE_xMnO_y$, where y is less than 3.

The oxygen-rich manganite region 304 has a resistance, less than the resistance of the oxygen-deficient manganite region 302. Together, the oxygen-rich and oxygen-deficient manganite regions 304/302 have an overall first resistance responsive to a negative electric field. The oxygen-rich and oxygen-deficient manganite regions 304/302 have an overall second resistance, less than the first resistance, responsive to a positive electric field. As used herein, field direction direction is defined from the perspective of the oxygen-rich manganite region 304, assuming that the oxygen-rich region 304 overlies the oxygen-deficient region 302, as shown in FIG. 3. In other words, the negative direction is from the oxygen-deficient region 302 to the oxygen-rich region 304. The positive direction is defined herein as being from the oxygen-rich region 304 to the oxygen-deficient region 302.

More specifically, the oxygen-rich and oxygen-deficient manganite regions 304/302 have a first resistance in the range of 100 ohms to 10 megaohms (Mohms), in response to a first, negative pulsed electric field having a field strength in the range of 0.1 megavolts per centimeter (MV/cm) to 0.5 MV/cm and a time duration in the range from 1 nanosecond (ns) to 10 microseconds (μs).

The oxygen-rich and oxygen-deficient manganite regions 304/302 have a second resistance in the range of 100 ohms to 1 kilo-ohm (kohm) in response to a second, positive pulsed electric field having a field strength in the range of 0.1 MV/cm to 0.5 MV/cm and a time duration in the range from 1 ns to 10 μs.

The two manganite regions 302 and 304 have different resistance properties, to insure the asymmetrical characteristics of the film 300. The oxygen-deficient manganite region 302 changes resistance in response to an electric field. However, the oxygen-rich manganite region 304 maintains a constant resistance in response to an electric field.

In some aspects, the oxygen-rich manganite region 304 has a thickness 306 in the range of 20 to 150 nanometers (nm). Likewise, the oxygen-deficient manganite region 302 can have a thickness 308 in the range of 20 to 150 nm. Considered together, the oxygen-deficient manganite region 302 has a thickness 308 within 0.5 to 1.5 the thickness 306 of the oxygen-rich manganite region 304.

Figure 4:
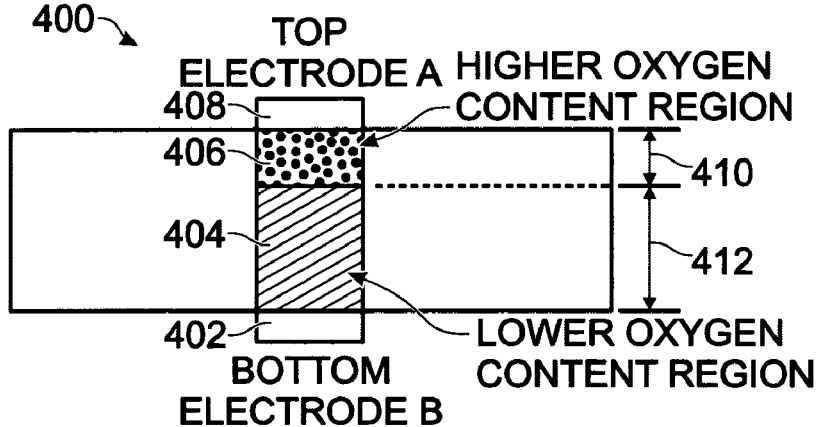
FIG. 4 is a partial cross-sectional view of the present invention memory cell with controlled oxygen content.

FIG. 4 is a partial cross-sectional view of the present invention memory cell with controlled oxygen content. The cell 400 comprises a bottom electrode 402 and an oxygen-deficient manganite region 404 overlying the bottom electrode 402. An oxygen-rich manganite region 406 is adjacent the oxygen-deficient manganite region 404 and a top electrode 408 overlies the oxygen-rich manganite region 406 and oxygen-deficient manganite region 404. As shown, the oxygen-rich manganite region 406 overlies the oxygen-deficient region 404. However, in other aspects (not shown), the oxygen-deficient manganite region 404 may overlie the oxygen-rich manganite region 406.

The oxygen-rich manganite region 406 is selected from the group including perovskite-type manganese oxides with the general formula $RE_{1-x}AE_xMnO_y$, where RE is a rare earth ion and AE is an alkaline-earth ion, with x in the range between 0.1 and 0.5, and y being greater than 3. The oxygen-deficient manganite region 404 is selected from the group including perovskite-type manganese oxides with the general formula $RE_{1-x}AE_xMnO_y$, where y is less than 3.

The top electrode 408 is a material such as Pt, TiN, TaN, TiAlN, TaAlN, Ag, Au, or Ir. Likewise, the bottom electrode 402 is a material such as Pt, TiN, TaN, TiAlN, TaAlN, Ag, Au, or Ir. The top electrode 408 need not necessarily be the same material as the bottom electrode 402.

The oxygen-rich manganite region 406 has a resistance, less than the resistance of the oxygen-deficient manganite region 404. Together, the oxygen-rich and oxygen-deficient manganite regions 406/404 have an overall first resistance responsive to a negative electric field. The oxygen-rich and oxygen-deficient manganite regions 406/404 have an overall second resistance, less than the first resistance, responsive to a positive electric field.

More specifically, the oxygen-rich and oxygen-deficient manganite regions 406/404 have a first resistance in the range of 100 ohms to 10 Mohms, in response to a first, negative pulsed electric field having a field strength in the range of 0.1 MV/cm to 0.5 MV/cm and a time duration in the range from 1 ns to 10 µs. As used herein, field direction is defined from the perspective of the electrode in contact with the oxygen-rich region 406. In the shown example, the negative direction is from the top electrode 408 in contact with the oxygen-rich region 406 to the bottom electrode 402 in contact with the oxygen-deficient region 404. The positive direction is defined herein as being from the electrode in contact with the oxygen-rich region 406 to the electrode in contact with the oxygen-deficient region 404. The oxygen-rich and oxygen-deficient manganite regions 406/404 have a second resistance in the range of 100 ohms to 1 kohm in response to a second, positive pulsed electric field having a field strength in the range of 0.1 MV/cm to 0.5 MV/cm and a time duration in the range from 1 ns to 10 µs.

The two manganite regions 404 and 406 have different resistance properties, to insure the asymmetrical characteristics of the cell 400. The oxygen-deficient manganite region 404 changes resistance in response to an electric field. However, the oxygen-rich manganite region 406 maintains a constant resistance in response to an electric field.

In some aspects, the oxygen-rich manganite region 406 has a thickness 410 in the range of 20 to 150 nanometers (nm). Likewise, the oxygen-deficient manganite region 404 can have a thickness 412 in the range of 20 to 150 nm. Considered together, the oxygen-deficient manganite region 404 has a thickness 412 within 0.5 to 1.5 the thickness 410 of the oxygen-rich manganite region 406.

FUNCTIONAL DESCRIPTION

The present invention cell or memory film can be made geometrically symmetrical, yet have physically asymmetrical characteristics. With the present invention device, the crystal structure of the memory resistor material is made practically uniform across the entire film. That is, from bottom electrode to the top electrode. However, the oxygen distribution is controlled through the memory resistor thin film, which in turn affects the device switching properties.

Figure 5A:
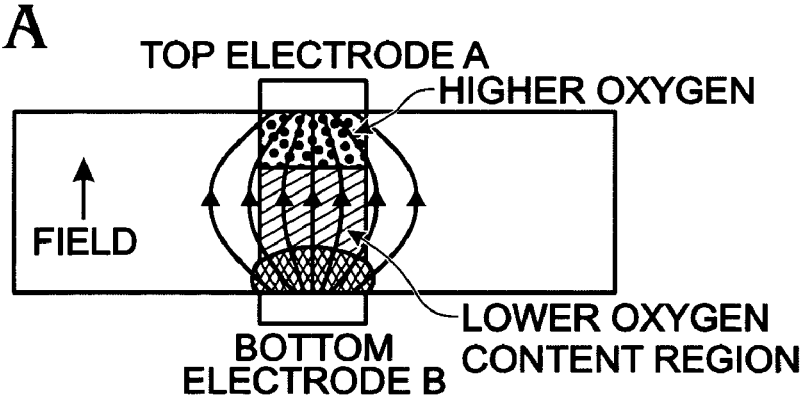
FIGS. 5a and 5b are partial cross-sectional views of the memory cell of FIG. 4 during programming and erasing operations, respectively.
Figure 5B:
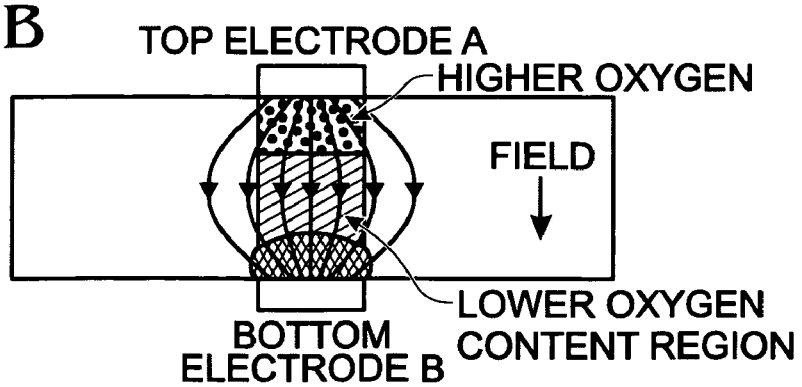

FIGS. 5a and 5b are partial cross-sectional views of the memory cell of FIG. 4 during programming and erasing operations, respectively. The upper portion of the memory resistor thin film has a higher oxygen content region, while the lower portion of the memory resistor thin film has a lower oxygen content region. The device exhibits good memory programming properties if the oxygen density in the upper portion, and that in the lower portion of the memory resistor film, are reversed. In that situation, the programming pulse polarity would be the reverse of the ones shown.

Figure 6:
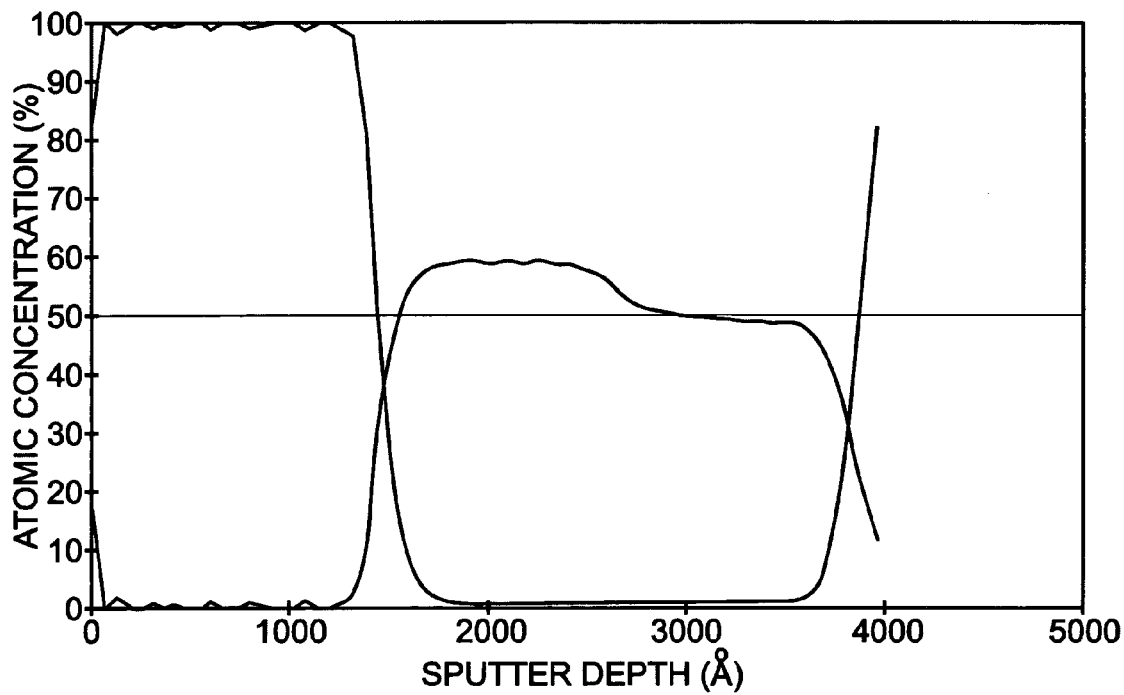
FIGS. 6 through 9 are diagrams of AES data for four memory resistors.
Figure 7:
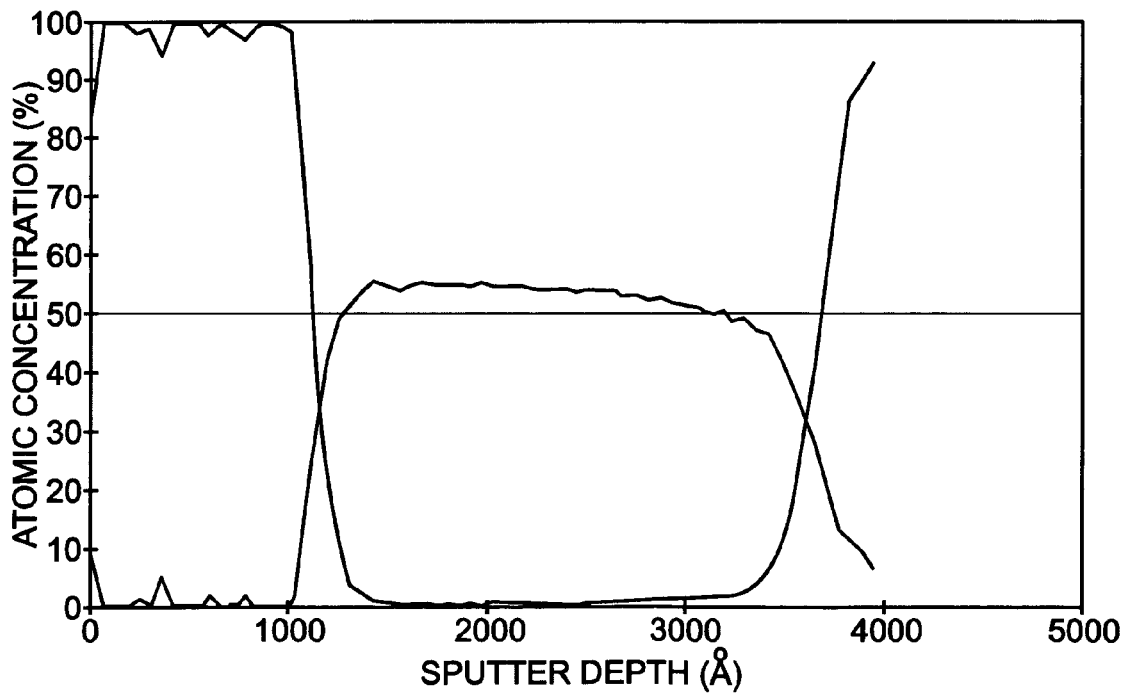
Figure 8:
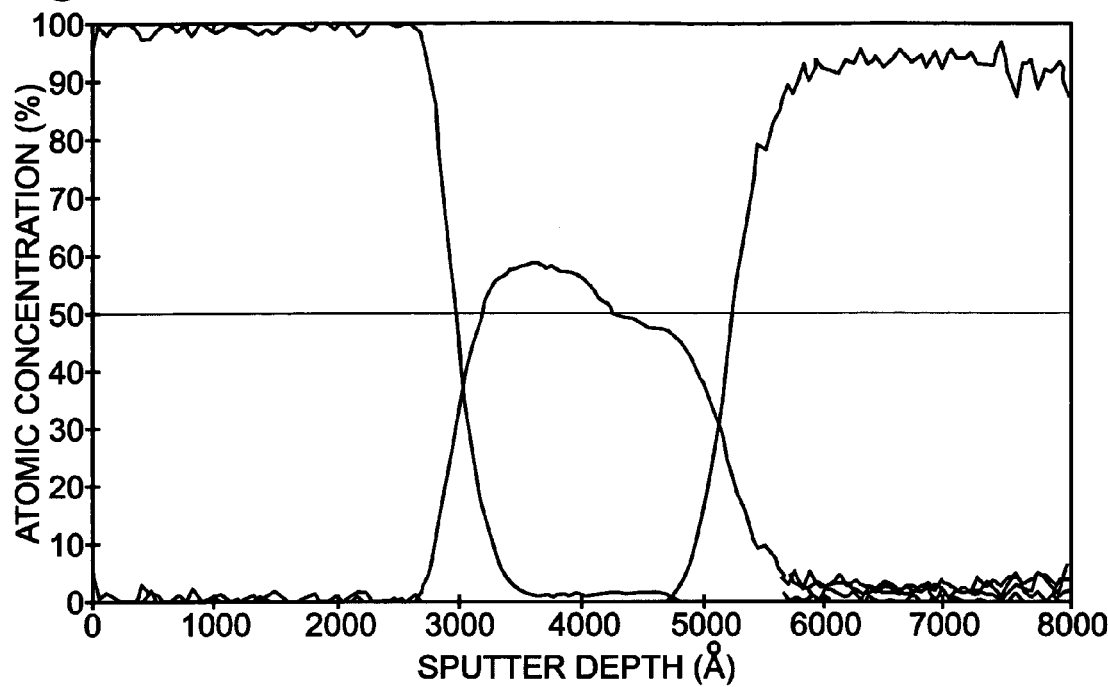
Figure 9:
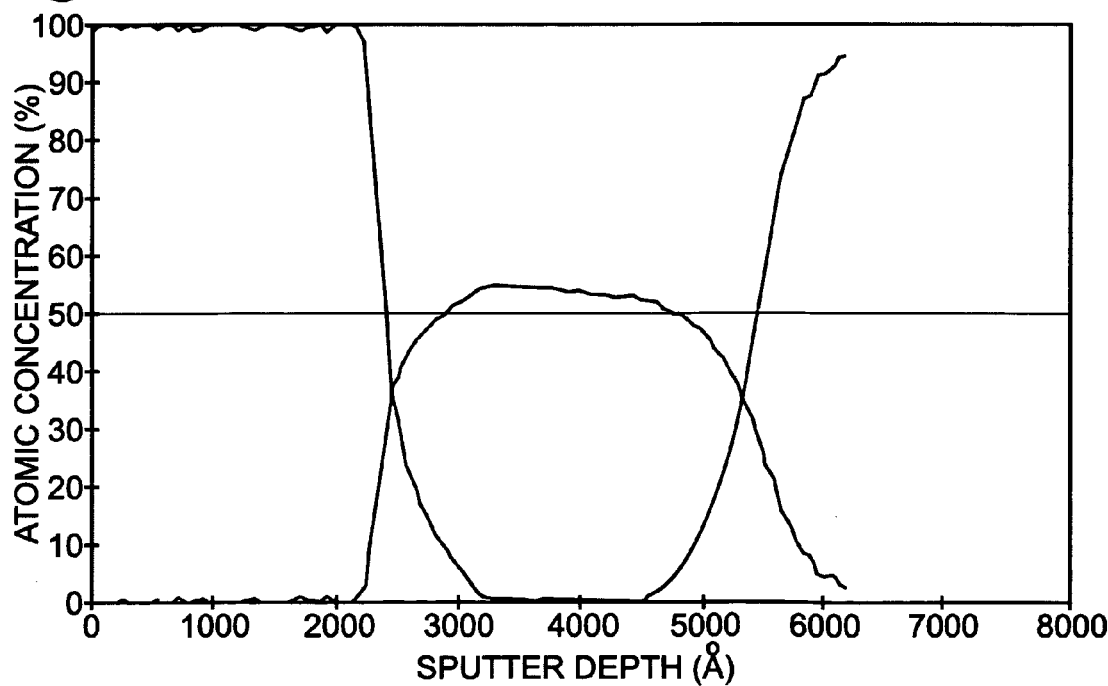

FIGS. 6 through 9 are diagrams of AES data for four memory resistors. The oxygen content of the four devices was controlled by an annealing process. The devices of FIGS. 6 and 7 are both fabricated with Pt top and bottom electrodes and a $Pr_{0.3}Ca_{0.7}MnO_3$ (PCMO) memory resistor material. The devices of FIGS. 8 and 9 are both fabricated with a Pt top electrode, an Ir bottom electrode, and a PCMO memory resistor film.

The devices of FIG. 6 and FIG. 8 were annealed in oxygen at 525° C. for up to 40 minutes. Both these devices exhibit approximately equal portions of memory resistor thin film having a greater than 50% oxygen content, and a lower that 50% oxygen content. Because of the oxygen content distinction, both samples exhibit good programming properties. When the samples were annealed at 600° C. for more that 5 minutes, the oxygen content is higher than 50% across the entire thin film. Both these sample (FIGS. 7 and 9) exhibit low resistivity. The resistance of these two samples does not response to a programming pulse.

The oxygen content in the memory resistor material can be controlled by annealing in oxygen ambient atmosphere. For a metalorganic spin deposition (MOD) film, the film is annealed at temperature of no higher than 550° C., for no longer than one hour. The oxygen content can also be controlled through metalorganic chemical vapor deposition (MOCVD) or physical vapor deposition (PVD) process.

FIG. 10 is a flowchart illustrating the present invention method for controlling the resistance properties in a memory material. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1000.

Step 1002 forms manganite. Step 1004 anneals the manganite in an oxygen atmosphere. For example, Step 1004 may anneal the manganite at a temperature of less than 600 degrees C. for a period of time less than 1 hour. Step 1006 controls the oxygen content in the manganite in response to the annealing. Step 1008 controls resistance through the manganite in response to the oxygen content.

Forming manganite in Step 1002 includes forming manganite from a material selected from the group including perovskite-type manganese oxides with the general formula $RE_{1-x}AE_xMnO_y$, where RE is a rare earth ion and AE is an alkaline-earth ion, with x in the range between 0.1 and 0.5. The manganite can be formed through a process such as PVD, MOCVD, or MOD, as mentioned above.

In some aspects, controlling the oxygen content in the manganite in response to the annealing in Step 1006 includes forming an oxygen-rich $RE_{1-x}AE_xMnO_y$ region where y is greater than 3. Then, controlling resistance through the manganite in response to the oxygen content in Step 1008 includes forming a low resistance in the oxygen-rich manganite region. In other aspects, controlling the oxygen content in the manganite in response to the annealing in Step 1006 includes forming an oxygen-deficient $RE_{1-x}AE_xMnO_y$ region where y is less than 3. Then, controlling resistance through the manganite in response to the oxygen content in Step 1008 includes forming a high resistance in the oxygen-deficient manganite region.

Typically, Step 1006 forms an oxygen-rich $RE_{1-x}AE_xMnO_y$ region where y is greater than 3, and an oxygen-deficient $RE_{1-x}AE_xMnO_y$ region where y is less than 3. Then, Step 1008 forms a first, low resistance in the oxygen-rich manganite region and a second resistance in the oxygen-deficient manganite region, higher than the first resistance. More specifically, the oxygen-rich manganite region is adjacent, either overlying or underlying, the oxygen-deficient manganite region.

Step 1010 applies a pulsed electric field to the manganite. Step 1012 changes the overall resistance through the manganite in response to the pulsed electric field.

In some aspects, applying a pulsed electric field to the manganite in Step 1010 includes applying a first, negative pulsed electric field (where field direction is defined from the perspective of the oxygen-rich region) having a field strength in the range of 0.1 megavolts per centimeter (MV/cm) to 0.5 MV/cm and a time duration in the range from 1 nanosecond (ns) to 10 microseconds (μs). Then, changing the overall resistance through the manganite in response to the pulsed electric field in Step 1012 includes creating an overall resistance in the range of 100 ohms to 10 megaohms (Mohms) in response to the first electric field.

In other aspects, Step 1010 applies a second, positive pulsed electric field (as defined above) having a field strength in the range of 0.1 MV/cm to 0.5 MV/cm and a time duration in the range from 1 ns to 10 μs. Then, Step 1012 creates an overall resistance in the range of 100 ohms to 1 kilo-ohm (kohm) in response to the second electric field.

In some aspects, changing the overall resistance through the manganite in response to the pulsed electric field (Step 1012) includes substeps. Step 1012a changes the resistance in the oxygen-deficient manganite region. Step 1012b maintains a constant resistance in the oxygen-rich manganite region.

FIG. 11 is a flowchart illustrating the present invention method for controlling the resistance properties in a memory resistor or memory cell. The method starts at Step 1100. Step 1102 forms a bottom electrode. Step 1104 forms manganite overlying the bottom electrode. Step 1106 forms a top electrode overlying the manganite. Step 1108 anneals the manganite in an oxygen atmosphere. For example, Step 1108 may anneal the manganite at a temperature of less than 600 degrees C. for a period of time less than 1 hour. Step 1110 controls the oxygen content in the manganite in response to the annealing. Step 1112 controls resistance through the manganite in response to the oxygen content.

Forming manganite in Step 1104 includes forming manganite from a material selected from the group including perovskite-type manganese oxides with the general formula $RE_{1-x}AE_xMnO_y$, where RE is a rare earth ion and AE is an alkaline-earth ion, with x in the range between 0.1 and 0.5. The manganite can be formed through a process such as PVD, MOCVD, or MOD, as mentioned above.

Forming a top electrode in Step 1106 includes forming a top electrode from a material such as Pt, TiN, TaN, TiAlN, TaAlN, Ag, Au, or Ir. Likewise, forming a bottom electrode in Step 1102 includes forming a bottom electrode from a material such as Pt, TiN, TaN, TiAlN, TaAlN, Ag, Au, or Ir. The top and bottom electrode materials need not necessarily be the same.

In some aspects, controlling the oxygen content in the manganite in response to the annealing in Step 1110 includes forming an oxygen-rich $RE_{1-x}AE_xMnO_y$ region where y is greater than 3. Then, controlling resistance through the manganite in response to the oxygen content in Step 1112 includes forming a low resistance in the oxygen-rich manganite region. In other aspects, controlling the oxygen content in the manganite in response to the annealing in Step 1110 includes forming an oxygen-deficient $RE_{1-x}AE_xMnO_y$ region where y is less than 3. Then, controlling resistance through the manganite in response to the oxygen content in Step 1112 includes forming a high resistance in the oxygen-deficient manganite region.

Typically, Step 1110 forms an oxygen-rich $RE_{1-x}AE_xMnO_y$ region where y is greater than 3, and an oxygen-deficient $RE_{1-x}AE_xMnO_y$ region where y is less than 3. Then, Step 1112 forms a first, low resistance in the oxygen-rich manganite region and a second resistance in the oxygen-deficient manganite region, higher than the first resistance. More specifically, the oxygen-rich manganite region is adjacent, either overlying or underlying, the oxygen-deficient manganite region.

Step 1114 applies a pulsed electric field to the manganite. Step 1116 changes the overall resistance through the manganite in response to the pulsed electric field.

In some aspects, applying a pulsed electric field to the manganite in Step 1114 includes applying a first, negative pulsed electric field (where field direction is defined from the perspective of the electrode in contact with the oxygen-rich region) having a field strength in the range of 0.1 MV/cm to 0.5 MV/cm and a time duration in the range from 1 ns to 10 μs. Then, changing the overall resistance through the manganite in response to the pulsed electric field in Step 1116 includes creating an overall resistance in the range of 100 ohms to 10 Mohms in response to the first electric field.

In other aspects, Step 1114 applies a second, positive pulsed electric field (as defined above) having a field strength in the range of 0.1 MV/cm to 0.5 MV/cm and a time duration in the range from 1 ns to 10 μs. Then, Step 1116 creates an overall resistance in the range of 100 ohms to 1 kohm in response to the second electric field.

In some aspects, changing the overall resistance through the manganite in response to the pulsed electric field (Step 1116) includes substeps. Step 1116a changes the resistance in the oxygen-deficient manganite region. Step 1116b maintains a constant resistance in the oxygen-rich manganite region.

A memory cell, where the memory properties are responsive to the oxygen content in the memory resistor material, and a method of fabricating such a memory cell have been provided. Examples have been given to illustrate features of the invention. However, the invention is not limited to merely these examples. Other variations and embodiments of the invention will occur to those skilled in the art.

We claim:

1. A memory resistance film with controlled oxygen content, the film comprising:
   an oxygen-deficient manganite region; and,
   an oxygen-rich manganite region, adjacent the oxygen-deficient manganite region.

2. The film of claim 1 wherein the oxygen-rich manganite region is selected from the group including perovskite-type manganese oxides with the general formula $RE_{1-x}AE_xMnO_y$, where RE is a rare earth ion and AE is an alkaline-earth ion, with x in the range between 0.1 and 0.5, and y being greater than 3; and,
   wherein the oxygen-deficient manganite region is selected from the group including perovskite-type manganese oxides with the general formula $RE_{1-x}AE_xMnO_y$, where y is less than 3.

3. The film of claim 2 wherein the oxygen-rich manganite region has a resistance, less than the resistance of the oxygen-deficient manganite region.

4. The film of claim 3 wherein the oxygen-rich and oxygen-deficient manganite regions have an overall first resistance responsive to a negative electric field; and,
   wherein the oxygen-rich and oxygen-deficient manganite regions have an overall second resistance, less than the first resistance, responsive to a positive electric field.

5. The film of claim 4 wherein the oxygen-rich and oxygen-deficient manganite regions have a first resistance in the range of 100 ohms to 10 megaohms (Mohms), in response to a first, negative pulsed electric field having a field strength in the range of 0.1 megavolts per centimeter (MV/cm) to 0.5 Mv/cm and a time duration in the range from I nanosecond (ns) to 10 microseconds (μs).

6. The film of claim 5 wherein the oxygen-rich and oxygen-deficient manganite regions have a second resistance in the range of 100 ohms to 1 kilo-ohm (kohm) in response to a second, positive pulsed electric field having a field strength in the range of 0.1 MV/cm to 0.5 MV/cm and a time duration in the range from 1 ns to 10 µs.

7. The film of claim 4 wherein the oxygen-deficient manganite region changes resistance in response to an electric field; and,
wherein the oxygen-rich manganite region maintains a constant resistance in response to an electric field.

8. The film of claim 4 wherein the oxygen-rich manganite region has a thickness in the range of 20 to 150 nanometers (nm).

9. The film of claim 1 wherein the oxygen-deficient manganite region has a thickness in the range of 20 to 150 nanometers (nm).

10. The film of claim 1 wherein the oxygen-deficient manganite region has a thickness within 0.5 to 1.5 the thickness of the oxygen-rich manganite region.

11. A memory cell with controlled oxygen content, the cell comprising:
a bottom electrode;
an oxygen-deficient manganite region overlying the bottom electrode;
an oxygen-rich manganite region, adjacent the oxygen-deficient manganite region; and,
a top electrode overlying the oxygen-rich and oxygen-deficient manganite regions.

12. The film of claim 11 wherein the oxygen-rich manganite region is selected from the group including perovskite-type manganese oxides with the general formula $RE_{1-x}AE_xMnO_y$, where RE is a rare earth ion and AE is an alkaline-earth ion, with x in the range between 0.1 and 0.5, and y being greater than 3; and,
wherein the oxygen-deficient manganite region is selected from the group including perovskite-type manganese oxides with the general formula $RE_{1-x}AE_xMnO_y$, where y is less than 3.

13. The film of claim 12 wherein the oxygen-rich manganite region has a resistance, less than the resistance of the oxygen-deficient manganite region.

14. The film of claim 13 wherein the oxygen-rich and oxygen-deficient manganite regions have an overall first resistance responsive to a negative electric field; and,
wherein the oxygen-rich and oxygen-deficient manganite regions have an overall second resistance, less than the first resistance, responsive to a positive electric field.

15. The film of claim 14 wherein the oxygen-rich and oxygen-deficient manganite regions have a first resistance in the range of 100 ohms to 10 megaohms (Mohms), in response to a first, negative pulsed electric field having a field strength in the range of 0.1 megavolts per centimeter (MV/cm) to 0.5 MV/cm and a time duration in the range from 1 nanosecond (ns) to 10 microseconds (µs).

16. The film of claim 15 wherein the oxygen-rich and oxygen-deficient manganite regions have a second resistance in the range of 100 ohms to 1 kilo-ohm (kohm) in response to a second, positive pulsed electric field having a field strength in the range of 0.1 MV/cm to 0.5 MV/cm and a time duration in the range from 1 ns to 10 µs.

17. The film of claim 14 wherein the oxygen-deficient manganite region changes the resistance in response to an electric field; and,
wherein the oxygen-rich manganite region maintains a constant resistance in response to an electric field.

18. The film of claim 11 wherein the oxygen-rich manganite region has a thickness in the range of 20 to 150 nanometers (nm).

19. The film of claim 11 wherein the oxygen-deficient manganite region has a thickness in the range of 20 to 150 nanometers (nm).

20. The film of claim 11 wherein the oxygen-deficient manganite region has a thickness within 0.5 to 1.5 the thickness of the oxygen-rich manganite region.

21. The capacitor of claim 11 wherein the top electrode is a material selected from the group including Pt, TiN, TaN, TiAlN, TaAlN, Ag, Au, and Ir; and,
wherein the bottom electrode is a material selected from the group including Pt, TiN, TaN, TiAlN, TaAlN, Ag, Au, and Ir.

* * * * *

UNITED STATES PATENT AND TRADEMARK OFFICE
CERTIFICATE OF CORRECTION

PATENT NO. : 7,148,533 B2
APPLICATION NO. : 11/226998
DATED : December 12, 2006
INVENTOR(S) : Sheng Teng Hsu and Fengyan Zhang It is certified that error appears in the above-identified patent and that said Letters Patent is hereby corrected as shown below:

Claim 8, Col. 9, Line 9-10 should read

8. The film of claim 1 wherein the oxygen-rich manganite region has a thickness in the range of 20 to 150 nanometers (nm).

Signed and Sealed this
Twenty-third Day of August, 2011

David J. Kappos
*Director of the United States Patent and Trademark Office*

UNITED STATES PATENT AND TRADEMARK OFFICE
CERTIFICATE OF CORRECTION

PATENT NO. : 7,148,533 B2  
APPLICATION NO. : 11/226998  
DATED : December 12, 2006  
INVENTOR(S) : Sheng Teng Hsu and Fengyan Zhang Page 1 of 1

It is certified that error appears in the above-identified patent and that said Letters Patent is hereby corrected as shown below:

Col. 9, claim 8, line 9-10 should read

8. The film of claim 1 wherein the oxygen-rich manganite region has a thickness in the range of 20 to 150 nanometers (nm).

Signed and Sealed this

Thirteenth Day of September, 2011

David J. Kappos  
*Director of the United States Patent and Trademark Office*